United States Patent
Riester et al.

(10) Patent No.: US 8,422,836 B2
(45) Date of Patent: Apr. 16, 2013

(54) PRINTED CIRCUIT BOARD ELEMENT AND METHOD FOR PRODUCING THE SAME

(75) Inventors: Markus Riester, Seiersberg (AT); Gregor Langer, Wölfnitz (AT)

(73) Assignee: AT & S Austria Technologie & Systemtechnik Aktiengesellschaft, Leoben-Hinterberg (AT)

( * ) Notice: Subject to any disclaimer, the term of this patent is extended or adjusted under 35 U.S.C. 154(b) by 719 days.

(21) Appl. No.: 12/297,123

(22) PCT Filed: May 8, 2007

(86) PCT No.: PCT/AT2007/000217
§ 371 (c)(1),
(2), (4) Date: Jan. 25, 2010

(87) PCT Pub. No.: WO2007/128022
PCT Pub. Date: Nov. 15, 2007

(65) Prior Publication Data
US 2010/0142896 A1    Jun. 10, 2010

(30) Foreign Application Priority Data
May 8, 2006 (AT) .................................. A 791/2006

(51) Int. Cl.
*G02B 6/12* (2006.01)
(52) U.S. Cl.
USPC ............... 385/14; 385/15; 385/31; 385/39; 385/49
(58) Field of Classification Search ............ 385/14, 385/15, 31, 39, 49
See application file for complete search history.

(56) References Cited

U.S. PATENT DOCUMENTS

| | | | |
|---|---|---|---|
| 4,666,236 A | 5/1987 | Mikami et al. | |
| 5,887,089 A * | 3/1999 | Deacon et al. | 385/22 |
| 6,845,184 B1 | 1/2005 | Yoshimura et al. | |
| 6,947,645 B2 * | 9/2005 | Korenaga et al. | 385/49 |
| 6,965,552 B2 | 11/2005 | Tokuda et al. | |
| 7,120,325 B1 | 10/2006 | Uchida | |
| 2002/0028045 A1 | 3/2002 | Yoshimura et al. | |
| 2002/0039464 A1 | 4/2002 | Yoshimura et al. | |

FOREIGN PATENT DOCUMENTS

| | | |
|---|---|---|
| CN | 1475824 A | 2/2004 |
| DE | 196 16 015 | 6/1997 |
| EP | 0 273 703 | 7/1988 |
| EP | 0 911 658 | 4/1999 |
| EP | 1 312 948 | 5/2003 |
| EP | 1 387 193 | 2/2004 |

(Continued)

OTHER PUBLICATIONS

English Abstract of JP 2000-249873 dated Sep. 14, 2000.

(Continued)

*Primary Examiner* — Jennifer Doan
(74) *Attorney, Agent, or Firm* — Ladas & Parry LLP

(57) ABSTRACT

A printed circuit board element (1) with a substrate (2), with at least one optoelectronic component (3) embedded in a photopolymerizable optical layer material (5), and with at least one optical waveguide (6) optically coupled with the former and structured in the optical material by photon absorption, wherein a prefabricated deflection mirror (4) embedded in the optical material (5) and optically coupled with the optoelectronic component (3) via the optical waveguide (6) is arranged on the substrate (2), optionally together with a support (4').

30 Claims, 4 Drawing Sheets

FOREIGN PATENT DOCUMENTS

| | | |
|---|---|---|
| EP | 1 701 188 | 9/2006 |
| EP | 1 715 368 | 10/2006 |
| GB | 2 155 194 | 9/1985 |
| JP | 2000-249873 | 9/2000 |
| TW | 541772 B | 3/2003 |
| WO | 2005/064831 | 7/2005 |

OTHER PUBLICATIONS

Office Action issued by the Taiwanese Patent Office and English translation.
Espacent English abstract of CN 1475824 A.
Espacenet English abstract of TW 541772 B.

* cited by examiner

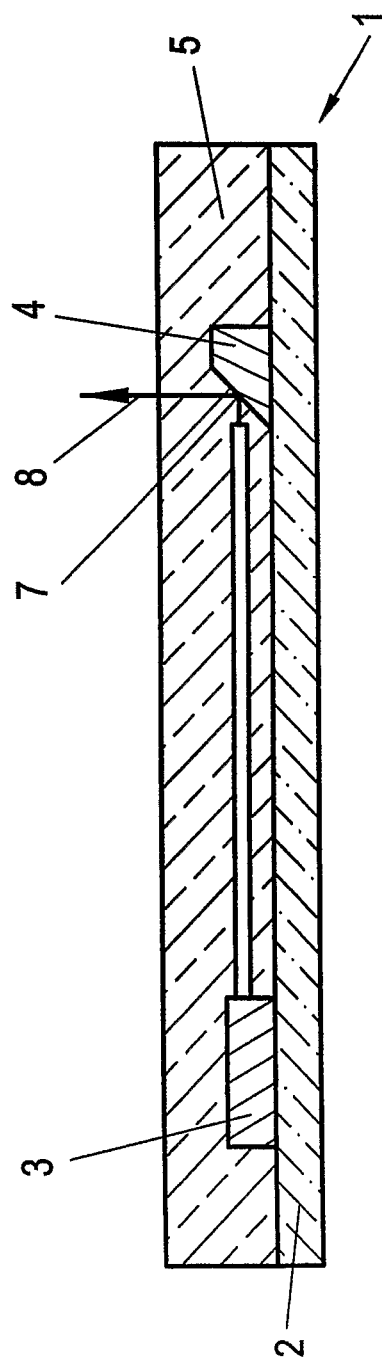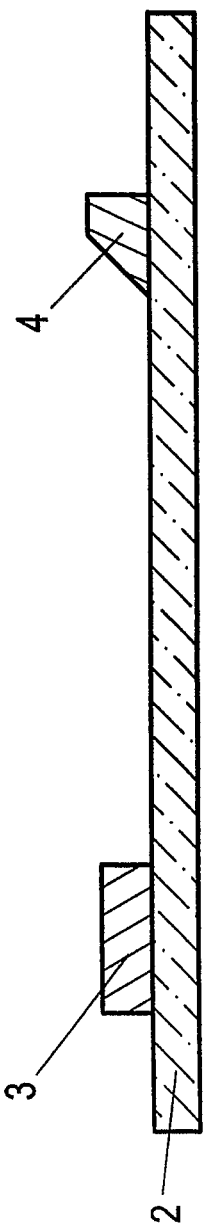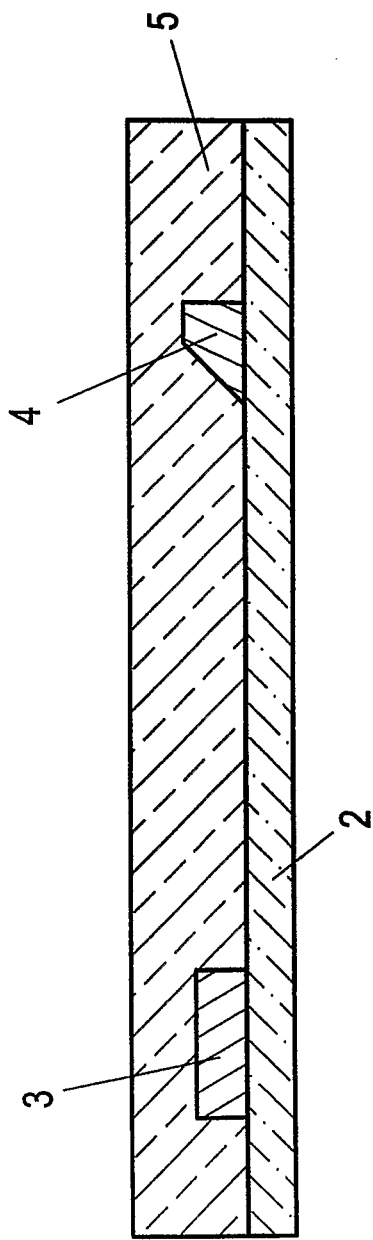

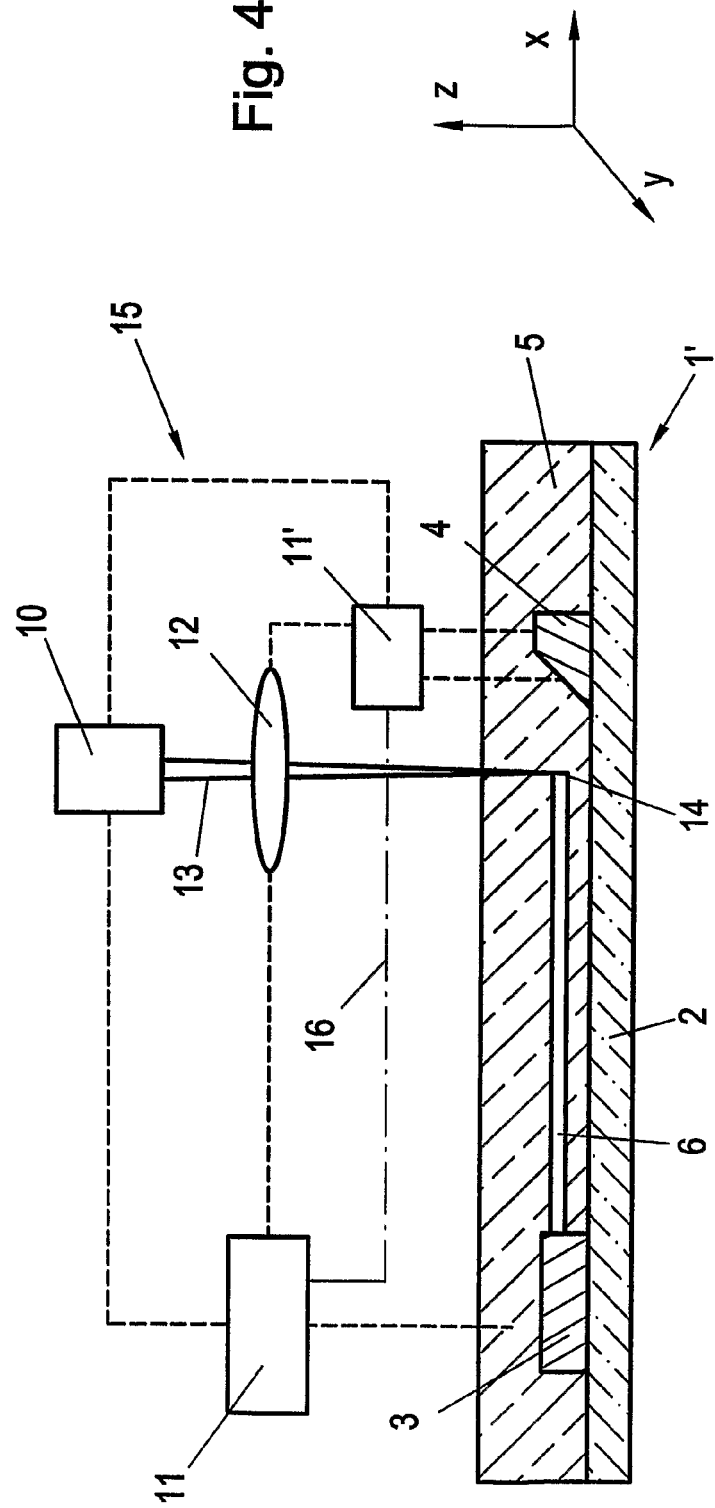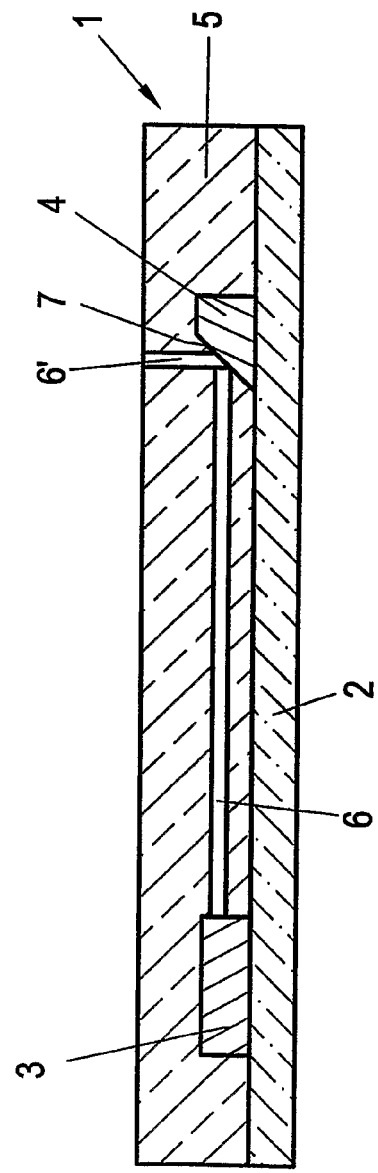

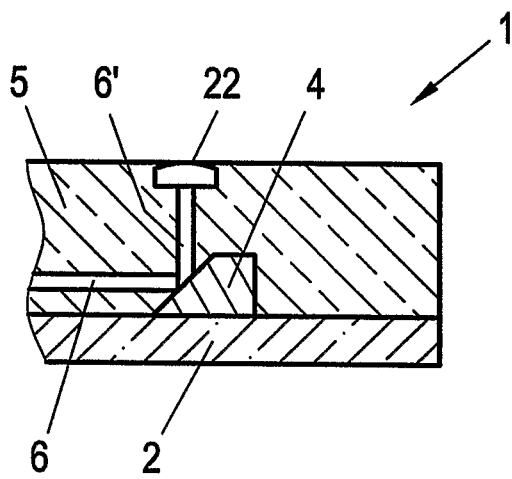
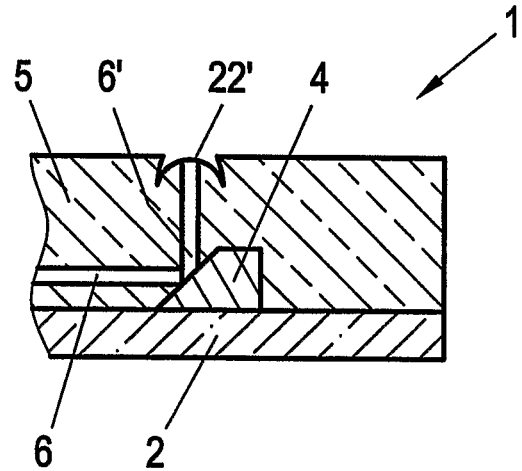
Fig. 9　　　　　　　　　Fig. 10
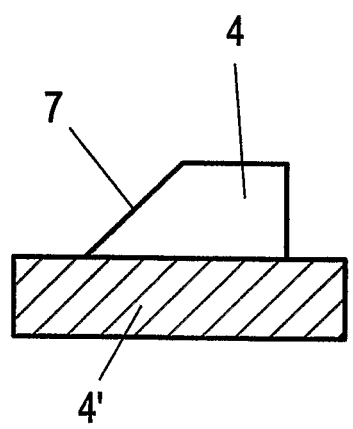
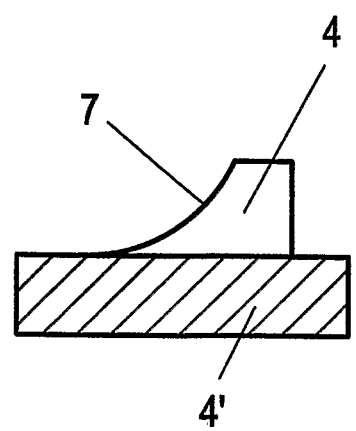
Fig. 11　　　　　　　　　Fig. 12

PRINTED CIRCUIT BOARD ELEMENT AND METHOD FOR PRODUCING THE SAME

The invention relates to a printed circuit board element with a substrate, with at least one optoelectronic component embedded in a photopolymerizable optical layer material, and with at least one optical waveguide optically coupled with the former and structured in the optical material by photon absorption.

The invention further relates to a method for producing such a printed circuit board element.

From WO 01/16630 A1, a multilayer printed circuit board element is known, in which optoelectronic components, in particular VCSEL components, are provided in connection with an optical waveguide. There, the optical waveguide is formed by an area-like optical waveguide layer arranged between buffer layers and within which the laser beam emitted by the VCSEL component has to be oriented by the aid of a deflection mirror. To this end, it is necessary that a narrow, bundled laser beam be generated by the VCSEL component and propagated by the deflection mirror. The respective VCSEL component is incorporated in one of the buffer layers adjacent the optical waveguide layer, whereas the planar, obliquely arranged deflection mirror is provided in the waveguide layer to deflect the emitted laser beam by 90° into the waveguide layer. With that mode of construction, the orientation of the VCSEL component and the associated deflection mirror is critical.

From EP 911 658 A1 and EP 1 312 948 A2, it is known to provide waveguide structures including deflection mirrors on a substrate, which deflection mirrors are arranged within a waveguide structure on predetermined out-coupling sites. In detail, the respective deflection mirror in that case is embedded in a liquid, light-sensitive layer—either subsequent or prior to the attachment of this layer—and, after this, the waveguide structure is produced by exposure, with the material of the light-sensitive layer hardening in the exposed area. The unhardened material of the light-sensitive layer is then removed. Subsequently, a covering layer comprised of a polymer having a refractive index differing from that of the waveguide is deposited onto this structure. The thus obtained structure is, hence, similar to that of the previously described WO 01/16630 A1, involving the problems of a critical component orientation and narrow beam guidance within the waveguide structure. It is, in particular, disadvantageous that the z-position (height position) of the waveguide can neither be adjusted nor changed during the writing process. This results in the disadvantage of a limited positioning range of the waveguide relative to the respective component. The positioning of the z-coordinate of the waveguide is, in fact, unavoidable if, for instance, the waveguide is to be positioned relative to aspherical deflection mirrors. If, for instance, compact waveguide structures having three-dimensional courses are desired, these will only be feasible, with the known technique, by extremely complex multi-step processes. Furthermore, predetermined out-coupling sites are required in that prior art, with lenses being provided on the covering layer in those coupling sites; the deflection mirrors have to be positioned relative to these lenses in a very precise manner.

From WO 03/005094 A1, a technique for coupling to optical waveguides embedded in printed circuit boards is, furthermore, known, wherein the optical waveguides are produced in an optical layer by an embossing process and light is coupled out by chamfered and mirrored optical waveguide ends. For positioning, mechanical guide marks are produced by the embossing process, which may serve as guide holes for MT pins. That way of production is relatively complicated, whereby, initially, the channels for the waveguides are to be produced in a transparent carrier film and chamfers are provided on the ends of the channels for the mirrors. After this, the channels are filled to form the waveguides.

On the other hand, it has already been known to produce an optical waveguide structure in an organic or inorganic photopolymerizable optical material by photon absorption processes, whereby the optical material, while being irradiated with photons, is locally converted in a manner as to have a larger refractive index than the original, unstructured optical material. This is known in the context of optocoupler components, for instance, from WO 01/96915 A2, WO 01/96917 A2 and U.S. Pat. No. 4,666,236 A. Comparable waveguide structuring in a photopolymerizable optical layer is known from WO 2005/064381 A1 in connection with a printed circuit board element, the technique described there forming the starting point for the present invention.

It is an object of the invention to propose a technique for printed circuit board elements, by which it is feasible in a simple manner to deflect light from the plane of an optical position in an optical printed circuit board element for the purpose of coupling the same out, or to couple light into the plane of this optical position, wherein waveguide structuring is still to be unproblematic while, in particular, not requiring any mechanical waveguide finishing. Furthermore, the subsequent insertion and orientation of the optical components are to be avoided so as to allow for a simple, extremely precise mounting of the optical and optoelectronic components in a printed circuit board element with an integrated optical system.

To solve this problem, the invention provides a printed circuit board element as characterized in claim 1 as well as a method as defined in claim 18. Advantageous embodiments and further developments are indicated in the dependent claims.

The technique according to the invention allows for the simple, yet highly precise production of a printed circuit board element in which a deflection mirror is embedded in the optical layer material for the purpose of coupling light into the waveguide or coupling light out of the waveguide. When producing such a printed circuit board element, no mechanical waveguide finishing is required, and the optical components and, in particular, also the deflection mirror can be fixed to the substrate in advance, prior to the application of the optical material in layer form and the structuring of the waveguide. Thus, a mechanical finishing procedure of the printed circuit board element as applied, for instance, for the purpose of producing bores for vertically coupling light out can be obviated, too. Moreover, it is of particular advantage that marks present, for instance, on the deflection mirror (or on a deflection mirror support) can be used when structuring the waveguide for the orientation of the laser beam "writing" the waveguide. Besides, it is possible without any problem to provide a light channel perpendicularly upwards to the surface of the printed circuit board element for coupling light in or out. In this respect, also the enabled positioning of the waveguide in the z-direction is particularly beneficial, yielding special advantages especially when premounting deflection mirrors. The combination provided by the subject matter of the invention, of a photon absorption method and a prefabricated deflection mirror arranged on the substrate, as a result, offers the advantageous option of fixing the z-position, i.e. height, of the optical waveguide in the photon absorption process, whereby it is additionally possible to write a waveguide from the respective deflection mirror vertically upwards for coupling light in or out, what has not been possible in the prior art. Above all, no extremely precise positioning of the deflection mirror is required, since a position control of the laser beam is possible—e.g. via markers provided on the deflection mirror—when writing the waveguide in the correct position. It is, furthermore, possible to produce lenses only subsequently in the optical material, with deviations of the position of the mirror being still compensateable.

In the technique according to the invention for structuring waveguides, a photon process known per se (e.g. two-photon absorption—TPA) is applied, which activates a chemical reaction (e.g. polymerization) by the simultaneous absorption of two or more photons. In doing so, it is advantageous that, due to the transparency of the optical material for the excitation wavelength, any point within the volume can be reached so as to readily allow for the writing of three-dimensional structures in the volume, whereby very small focus ranges and, hence, very small structural dimensions can, moreover, be achieved. Besides, the two-photon process is a simple one-step structuring process.

In detail, when structuring the optical waveguide within the optical layer, it may advantageously be proceeded in the manner described in WO 2005/064381 A1, wherein the components already embedded in the optical layer are targeted by a measuring light beam using a camera or similar optical vision unit, and are detected in terms of position; via this vision unit, a radiation unit including a lens system is then controlled to move the focus region of the emitted photon beam, in particular laser beam, in the plane of the printed circuit board element, i.e. in the x/y plane, on the one hand, and to adjust the same also in terms of depth within the optical layer, i.e. in the z-direction, on the other hand. Using the respective component as a reference element, the optical waveguide can, thus, be structured in the desired fashion within the optical layer, e.g. as a simple, linear optical waveguide connection or also as a waveguide structure having curvatures, junctions or similar structures and, in particular, even as a three-dimensional structure. The cross-sectional dimensions of the thus structured optical waveguide can, for instance, range in the order of some micrometers, wherein the cross section of such a structurized optical waveguide may be circular, yet also elliptical or rectangular; the exact shape can be determined by the photon beam and its focus control.

With the technique according to the invention, it is of particular advantage that the deflection mirror (or a mirror support) likewise embedded in the optical material may comprise position marks for controlling the laser beam during the structuring of the optical waveguide in order to ensure an accurate guidance of the laser beam in the X/Y plane; above all, the deflection mirror (or its support) may also comprise marks such as an (optionally obliquely) upwardly facing reflective field for determining the height position during the structuring of the optical waveguide. The deflection mirror is preferably applied, particularly glued, to the same substrate to which also the optoelectronic component is attached. The deflection mirrors may be set in the same operating step as the optically active components, i.e. optoelectronic components such as, e.g. VCSEL components and/or photodiodes, so as to ensure a particularly simple production.

For the deflection mirrors, prefabricated silicon blocks provided, for instance, with planar 45°-inclined surfaces to obtain a 90° light deflection may be inserted. In addition to silicon material, also glass, a thermoplast or a duroplast or even an inorganic/organic hybrid polymer may be used for the deflection mirrors, mirroring by a metal coating being feasible. The deflection mirror, in particular, comprises a prismatic body with a planar or concave, i.e. (a) spherical, mirror surface, wherein, in the case of a slightly concavely configured mirror surface, a focusing effect for the light beam will be achieved by the concave-mirror shape.

It is, furthermore, favorable if, as already indicated above, a further optical waveguide is optically coupled with the deflection mirror in order to guide within an optical waveguide both a light beam impinging on it and a light beam reflected by it, i.e. the light beam is guided in the structured optical waveguide both parallelly with the plane of the printed circuit board element and perpendicularly thereto, in order to avoid possible light losses during coupling-in and coupling-out proper. The optical waveguide may, moreover, be structured in a manner as to not be completely extended as far as to the deflection mirror, but to end at a—small—distance in front of the same. This will, above all, be the case where the deflection of the light to the surface of the printed circuit board element is feasible without a waveguide path. However, the present structuring of the optical waveguide by a photon process readily enables the guidance of the deflection mirror exactly as far as to the deflection mirror during structuring. Furthermore, such structuring by a photon process also renders feasible, in the event of an additional, vertical optical waveguide leading to the upper side of the optical layer, to structure on this upper side in the region of the end of the optical waveguide a focusing lens in the optical material in order to achieve an additional focusing of the light beam after its reflection at the deflection mirror. Instead of using photon structuring, such a focusing lens in the region of emergence of the vertically upwardly leading optical waveguide can, however, also be produced by removing material from the surface of the optical material, for instance by laser ablation, such that a lens is "burned" into the optical material. Another option consists in producing the lens by a molding or stamping process, since the optical material is still soft and moldable during the photon structuring process.

The deflection mirror, instead of being machined by sawing or grinding from silicon, glass or duroplasts (e.g. polyester, cured epoxy resins, formaldehyde resins) as already mentioned, may also be produced from materials suitable for molding processes, wherein, for instance, UV-curing materials such as inorganic-organic hybrid polymers, or thermoplastic materials such as, e.g., polycarbonate, polymethylmethacrylate or polystyrene may be employed. In this respect, it is, in particular, also conceivable to simultaneously produce a plurality of deflection mirrors on a support such as, for instance, a silicon wafer, on glass, or on a support made of a polymer, e.g. polyimide, for instance, according to the molding process as basically known from EP 1 460 738 A, yet in the context of the production of semiconductor components. This is a simple and cost-effective option to produce a plurality of mirrors with planar, yet optionally also spherical or aspherical mirror surfaces, the remaining silicon wafers of the individual deflection mirrors facilitating the handling and insertion of the components.

Hence results that, in the main, the present technique renders feasible a printed circuit board element which is extremely cost-effective to produce and with which the advantage of a simultaneous insertion of the components, namely the deflection mirror and, at the same time, other elements, e.g. the optically active elements like laser components and photodiodes etc. is to be regarded as particularly essential. Precise positioning of the components is not necessary in this case, the components rather may be attached using a commercially available SMT device. Waveguide structuring will then take place in a subsequent step, the coupling of the optical waveguide to the components being possible with an extremely high precision based on the measurable positions of the previously attached components, with deviations such as, for instance, deviations in the angular positions or height deviations being automatically compensateable during waveguide structuring.

The printed circuit board elements according to the invention enable multi-mode or single-mode data transfers at extraordinarily high data transfer rates, and the invention may advantageously be used with printed circuit boards, e.g. optoelectronic backplanes or flex printed circuit boards, for cell phones and other so-called handhelds.

In the following, the invention will be explained in more detail by way of particularly preferred exemplary embodiments, to which it is, however, not to be restricted, and with reference to the drawing. In the drawing, in detail:

FIG. 1 is a schematic sectional view of a printed circuit board element according to the invention comprising an optoelectronic component and a deflection mirror attached to the same substrate at a distance from the former;

FIGS. 2, 3 and 4 depict consecutive manufacturing steps in the production of such a printed circuit board element according to FIG. 1;

Figures 6, 8:
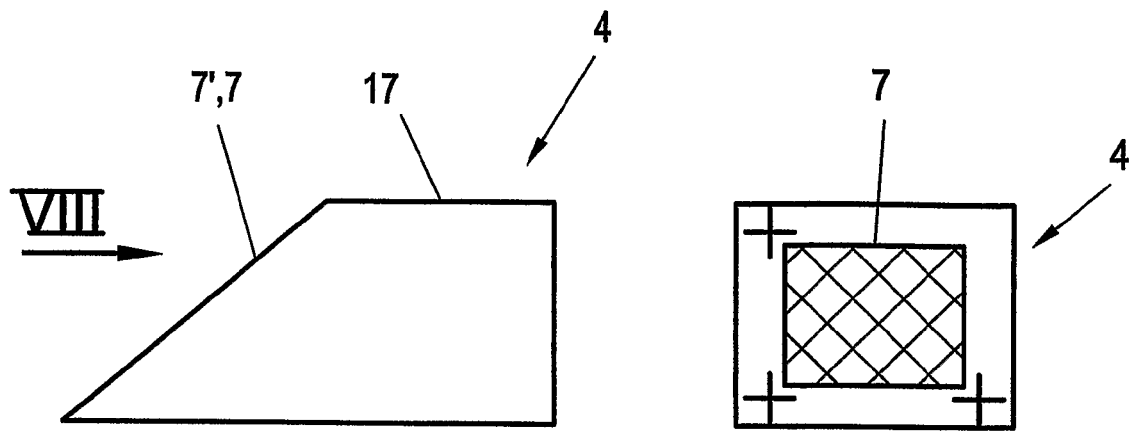
Figure 7:
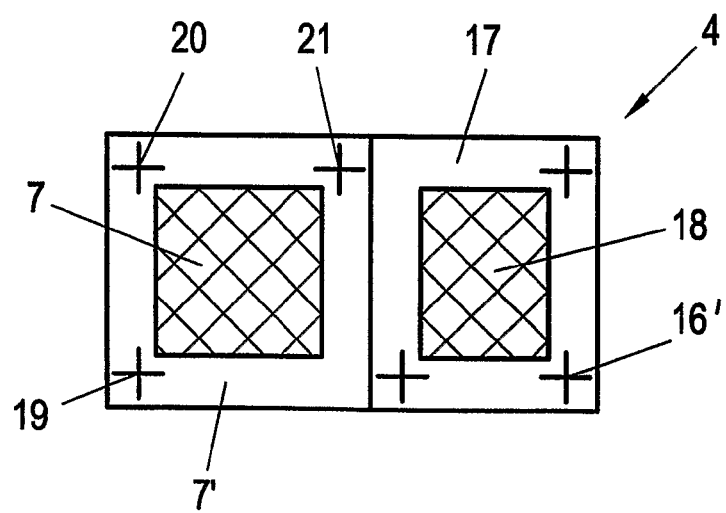

FIG. 5, in a schematic sectional view similar to that of FIG. 1, shows a modified embodiment of a printed circuit board element, in which a further waveguide path adjoins the deflection mirror;

FIGS. 6, 7 and 8 depict an exemplary embodiment of a prefabricated deflection mirror, e.g. made of silicon or glass, in an elevational view, top view and side view, respectively;

FIGS. 9 and 10, in illustrations similar to the sectional view of FIG. 1, show cut-outs of two printed circuit board elements formed with focusing lenses on the exit end of another, vertical optical waveguide; and FIGS. 11 and 12 illustrate two examples of prefabricated deflection mirrors, i.e. mirrors produced by a molding process on substrates or carriers.

FIG. 1 schematically depicts a printed circuit board element 1 with a substrate 2, e.g. a usual FR4 substrate. To this substrate 2 are attached various components in a single operation, FIG. 1 illustrating, by way of example, an optoelectronic component 3 such as a laser diode, and a passive component in the form of a deflection mirror 4. These components 3, 4 (as well as other components not illustrated in detail in the drawing) can be fixed to the substrate 2 for instance by gluing. It should be mentioned that FIG. 1 and the following Figures do not show the conductors required for contacting the components in detail, e.g. 3 and 4, such as structured copper layers and/or contact bores etc. In this respect, it is, for instance, referred to WO 2005/064381 A1, the disclosure of which is to be regarded as included herein by way of reference.

Components 3, 4, in the exemplary embodiment according to FIG. 1, are embedded in a uniform photopolymerizable optical layer material 5, in which an optical waveguide 6 is, furthermore, structured by a two- or multi-photon absorption process. This optical waveguide 6 extends from the optoelectronic component 3, for instance, as far as to closely in front of the 45° mirror surface 7 of the deflection mirror 4. However, it is, of course, also possible, and preferred in many cases, to guide the optical waveguide 6 directly as far as to the mirror surface 7, as is the case in the exemplary embodiment according to FIG. 5. Such a slight distance between the end of the waveguide 6 and the mirror surface 7 of the deflection mirror 4 as in accordance with FIG. 1 will not raise any problems if the light can be simply deflected to the upper side (cf. arrow 8) by the deflection mirror 4 through the—thin—optical material 5. By contrast, a further waveguide path 6' is provided in the exemplary embodiment according to FIG. 5, for coupling light in or out as will be explained in more detail below.

When producing a printed circuit board element 1 according to FIG. 1, it is proceeded such that an appropriate substrate 2 such as an epoxy resin substrate, e.g. the abovementioned FR4 substrate, is equipped with the components, i.e., in particular, the optoelectronic component 3 and the passive component in the form of the deflection mirror 4, in a single operation. The components 3, 4 etc. are attached to the substrate 2, particularly by gluing; such an adhesive connection allows also electrical contacts to be provided in the region of the optoelectronic component 3, which is, however, not to be elucidated here. A substrate thus equipped with components 3, 4 is illustrated in FIG. 2.

After this, the optical layer 5 of photopolymerizable material is applied onto the substrate 2, cf. FIG. 3, with the components 3, 4 previously attached to the substrate 2 being embedded in this layer 5. The application of the optical layer 5, which is comprised of a photoreactive polymer, may, for instance, be realized by casting, doctoring or even spin-coating, as known per se.

By photon radiation, the optical material of the layer 5 is subsequently converted locally in a manner as to have a comparatively elevated refractive index locally to thereby structure the desired optical waveguide 6.

This local conversion of the photoreactive, optical material 5 by the aid of photon beams is schematically illustrated in FIG. 4. From this, a light source 10 such as a laser source is apparent, which is coupled with a vision unit 11 and has a lens system 12 ahead of it for focusing the emitted laser beam 13 in a focus region 14 within the optical material 5.

In detail, during such structuring of the optical material 5 by the aid of the vision or sighting unit 11, for instance, by departing from the optoelectronic component 3, whose coordinates are detected, the distances on the sample 1' provided by the printed circuit board element (to the extent present) are measured, and the relative movement between said sample 1' and the exposure system 15 formed by the laser source 10 and the lens system 12 is controlled not only in the plane of the sample 1', i.e. in the x- or y-direction, but also in the thickness direction of the sample 1', i.e. in the z-direction, in order to obtain the focus region 14 of the laser beam 13 on the desired site within the optical material 5. In a preferred manner, the sample 1' is moved in all three directions x, y and z in order to move the focus region 14 in the desired manner relative to the sample 1' within the latter and thereby convert the optical material 5 locally by the photon radiation; in this manner, the structured optical waveguide 6 is formed. In the focus region 14, the intensity of the laser light is, in fact, so high as to induce the known two-photon absorption process. This process causes the optical material 5 to react (polymerize) in a manner as to form the optical waveguide 6, which has a higher refractive index than the optical material 5 surrounding it. Hence results an optical waveguide 6 similar to a fiber-optic cable, where, in the event of a light transmission by appropriate reflections of the light at the interface between the optical waveguide 6 and the surrounding material 5, a bundled light transmission without important optical losses will be achieved.

In a subsequent step, an upper printed circuit board layer (not illustrated) comprising an epoxy resin layer and a copper outer layer may optionally be applied on the optical material 5, in particular by pressing, and the steps usually applied for electrical contacting may be taken; this is conventional per se and not to be elucidated herein.

In the present printed circuit board element 1 or 1', the position of the deflection mirror 4 can also be optically detected by a sighting unit 11', for which purpose the deflection mirror 4 may carry appropriate marks as will be explained in more detail by way of FIGS. 6 to 8. The sighting unit 11' may be provided in addition or as an alternative to the sighting unit 11, or it may be one and the same—displaced—sighting unit; it is, in particular, also feasible to provide a two-part sighting unit with a unitary computation device, for instance in the region of the main sighting unit 11, so that the complementary sighting unit 11' will then comprise a suitable connection 16 to said main sighting unit 11, which connection is entered in dot-and-dash lines. On the other hand, it is, however, also conceivable to solely provide the sighting unit 11', with the controls, illustrated by broken lines, of the laser source 10 and the optics 12 being consequently provided.

In the previously described technique, it is of particular advantage that the orientation of the respective optical waveguide 6 can be adapted in situ, if appropriate reference marks (cf. FIGS. 6 to 8) for the localization of the site for coupling in or out are provided in three dimensions on the deflection mirror or, generally, on the components.

FIG. 5 depicts a printed circuit board element 1 which is substantially configured in a manner similar to that of FIG. 1, yet differs from the latter in that the optical waveguide 6 extending parallely with the plane of the printed circuit board element 1 is guided directly as far as to the mirror surface 7 of the deflection mirror 4, with a further optical waveguide path 6' having been structured from said mirror surface 7 vertically upwards to the upper face of the printed circuit board element, 1A. This is possible without any problem with the present printed circuit board element 1 and makes subsequent mechanical finishing procedures superfluous, since each of the waveguides 6 and 6' can be positioned directly at the optical components 4 (and also 3) in a highly precise manner by photon structuring, and because structuring in the z-direction (cf. FIG. 4) is also readily possible by such photon structuring. In this manner, the embodiment according to FIG. 5 allows for the deflection of light from the plane of the optical position (and into the plane of the optical position, respectively).

The deflection mirror 4 may, for instance, be prefabricated from silicon or glass with a metal coating, and as is apparent from the drawing, particularly from FIGS. 6 to 8, it is preferably comprised of a prismatic body having, e.g., a slanted (cf. FIGS. 6 and 9 to 11) or concave (cf. FIG. 12) front surface 7' to form a mirror surface 7 or the reflection field for the light in the waveguide 6 (cf. FIG. 1 or 5). In the exemplary embodiment illustrated, this is a 45°-deflection mirror 4 such that the light beam is deflected by a total of 90° from the plane of the printed circuit board element 1 in a direction perpendicular to the same (or vice versa), as is also apparent from FIGS. 1 and 5. The prefabricated deflection mirror 4 may comprise different marks for the positioning of the laser beam 13 or focal point 14 during the structuring of the optical waveguides 6 and 6', respectively. Thus, for instance, according to FIG. 7, marks 16' are provided on the plane upper side 17 of the deflection mirror 4 for determining the position, or a possible rotation, of the deflection mirror 4 via the sighting unit 11' (cf. FIG. 4). Furthermore, a reflective field 18 may be provided on the upper side 17 of the deflection mirror 4 for determining the z-position of the deflection mirror 4 via the reflection of the measuring laser in the sighting unit 11'.

In addition to, or instead of, the above, it is also possible to provide position marks 19, 20 and 21 at the front surface 7' in the region of the mirror surface 7 in order to enable the determination of the position of the front surface of the deflection mirror 4 via the sighting unit 11'. The position marks 19, 20 and 21 are, above all, provided to recognize deviations of the slant (in the event of a plane mirror surface 7) or of the curved surface (in the event of a spherical or aspherical mirror 7) from the desired position, such deviations being, for instance, caused by production inaccuracies or insertion inaccuracies. When scanning the position marks 19, 20, 21, it will then be possible to appropriately react to such deviations by adapting the angle of impingement of the optical waveguide 6 and/or 6' on the mirror surface 7 such that the light beam guided through the structured optical waveguide 6 and/or 6' will be optimally reflected from the deflection mirror 4 upwardly or towards the optoelectronic component 3.

An advantage of the present technology resides in that the deflection mirror 4 can be attached to the printed circuit board substrate 2 simultaneously with the optically active components 3.

What is also advantageous is the use of the photon process for structuring the waveguide 6, 6' in the photopolymerizable optical material 5 in which the components 3, 4 are embedded, wherein it is feasible, particularly by the aid of the sighting unit 11, 11', to detect both the position of the deflection mirror 4 per se and a possible rotation or tilting as may occur during the automatic insertion process; this will enable an appropriate adaptation and exact orientation when structuring the optical waveguide 6, 6' such that no extreme preciseness is previously required for the insertion process. The measuring laser beam of the sighting unit 11, 11' also allows for the precise determination of the z-position of the deflection mirror 4, the position of the upper edge of the deflection mirror 4, based on the substrate surface, or based on the surface of the optical layer 5. The thus detected position data in the x-, y- and z- directions, including a possible rotation of the deflection mirror 4, will then enable the optical waveguide 6 to be written both at the appropriate angle and at the correct height within the optical layer 5 towards the deflection mirror 4, cf. FIG. 4, wherein it is, of course, also possible to write the optical waveguide 6 from the deflection mirror 4 in the direction to the optoelectronic component 3. Furthermore, it is possible to write the vertical waveguide path 6' perpendicularly upwardly to the upper side of the optical layer 5 as illustrated in FIG. 5, in order to achieve the optimum coupling in or coupling out of the light.

When structuring the optical waveguide(s) 6, 6', an optical lens and, in particular, a focussing lens 22 may also be written in the optical layer 5, cf. FIG. 9, to focus the light beam upwardly reflected by the deflection mirror 4 and guided in the additional optical waveguide 6'. As is, moreover, apparent from FIG. 10, it is also conceivable to produce such a lens 22" for focussing the emerging light beam in any other way, e.g.. by removing (for instance through laser ablation) the optical material of the layer 5 in the manner of a burning in of the lens 22', or even by a molding or stamping process, wherein it is to be taken into account that the optical material of the layer 5 is still soft and, hence, moldable during the photon structuring process.

In the foregoing, silicon and glass, with a metal coating, have been exemplified as materials to be used for the premanufacture of the deflection mirror 4. Duroplasts such as, e.g., polyester, cured epoxy resins or formaldehyde resin3, with metal coatings, may also be envisaged; from such materials, deflection mirrors 4 are, for instance, produced by sawing or grinding. The production of the deflection mirrors by a molding process is, however, also feasible; to this end, moldable materials such as, for instance, UV-curing materials, e.g. inorganic-organic hybrid polymers, may be used, which are cured by UV light after molding; thermoplastic materials such as, e.g., polycarbonate, polymethylmethacrylate or polystyrene, which are appropriately shaped into mirrors in the soft state and subsequently cured while being cooled are yet another option. Deflection mirrors may, for instance, be formed on a silicon support (wafer) in a layer applied thereon, the individual deflection mirrors being cut out together with their silicon supports after curing, as is basically known from the field of semiconductor component manufacturing. FIGS. 11 and 12 illustrate two such deflection mirrors 4 with silicon supports 4', FIG. 11 showing in detail a deflection mirror 4 provided on a substrate or support 4' and having a plane mirror surface 7; FIG. 12, on the other hand, showing a deflection mirror 4 formed on a substrate 4' and having a concave (or spherical or aspherical) mirror surface 7.

As opposed to the known techniques, it is not necessary with the invention to mechanically interrupt the optical waveguide 6, 6' during the manufacturing process or after the manufacturing process, or to aftertreat the same in any manner whatsoever. Nor is the deflection mirror 4 inserted subsequently, which would involve additional expenditures, and it need not be oriented relative to the optical waveguide 6, either. Through measurements by the aid of the sighting unit 11 and/or 11", any deviation of the position of the deflection mirror 4 due, for instance, to insertion inaccuracies, unevennesses of the substrate 2, etc., of each individual mirror 4 can be detected so as to enable the optical waveguide 6, 6' to be optimally positioned relative to the deflection mirror 4.

Due to the fact that the deflection mirror 4 is attached to the same substrate 2 as the optoelectronic component 3, it is feasible in an advantageous manner to apply the components 3, 4 (and other components) in one and the same insertion procedure, what will result not only in time and cost savings, but also in higher insertion accuracies.

The invention claimed is:

1. A printed circuit board element with a substrate, with at least one optoelectronic component embedded in a photopolymerizable optical layer material, and with at least one optical waveguide optically coupled with the former and structured in the optical material by photon absorption, wherein a prefabricated deflection mirror embedded in the optical material and optically coupled with the optoelectronic component via the optical waveguide is arranged on the substrate.

2. The printed circuit board element according to claim 1, wherein the deflection mirror is arranged on the substrate together with a support.

3. The printed circuit board element according to claim 1, wherein the deflection mirror and/or its support comprise position marks for controlling a laser beam during the structuring of the optical waveguide.

4. The printed circuit board element according to claim 3, wherein the deflection mirror and/or its support comprise an upwardly facing reflective field for determining the height position during structuring.

5. The printed circuit board element according to claim 3, wherein the deflection mirror, in the region of its mirror surface, comprises marks for determining deviations of the mirror surface from the desired position and for controlling the laser beam during the structuring of the optical waveguide in order to ensure the optimum guidance of a light beam in the optical waveguide in front of and/or behind the deflection mirror.

6. The printed circuit board element according to claim 1, wherein the deflection mirror is applied on the same substrate which carries the optoelectronic component.

7. The printed circuit board element according to claim 1, wherein the deflection mirror is glued to the substrate.

8. The printed circuit board element according to claim 1, wherein the deflection mirror is made of a silicon material, a thermoplast, a duroplast, glass, or an inorganic/organic hybrid polymer, including a metal coating.

9. The printed circuit board element according to claim 1, wherein the deflection mirror comprises a prismatic body having a plane mirror surface.

10. The printed circuit board element according to claim 1, wherein the deflection mirror comprises a concave mirror surface.

11. The printed circuit board element according to claim 1, wherein a further optical waveguide is optically coupled with the deflection mirror to guide within an optical waveguide both a light beam impinging on it and a light beam reflected by it.

12. The printed circuit board element according to claim 11, wherein a focussing lens is associated with said further optical waveguide in the region of the surface of the optical material.

13. The printed circuit board element according to claim 12, wherein the lens is obtained in the optical material by photon absorption structuring.

14. The printed circuit board element according to claim 12, wherein the lens is obtained in the optical material by laser ablation.

15. The printed circuit board element according to claim 12, wherein the lens is obtained in the optical material by a molding or stamping process.

16. The printed circuit board element according to claim 1, wherein the or at least one optical waveguide ends at a distance in front of the deflection mirror.

17. The printed circuit board element according to claim 1, wherein the or at least one optical waveguide, preferably both optical waveguides, are guided as far as to the deflection mirror.

18. A method for producing a printed circuit board element according to claim 17, wherein the deflection mirror is attached to the substrate and the photopolymerizable optical material is subsequently applied in layer form, whereby the deflection mirror is embedded in said optical material, and the optical waveguide is then structured by photon absorption, by directing the laser beam onto the desired site in the optical material and relatively moving said laser beam and said substrate along with said optical material.

19. The method according to claim 18, wherein the deflection mirror is applied on the substrate together with a support.

20. The method according to claim 18, wherein the deflection mirror or support is glued to the substrate.

21. The method according to claim 18, wherein the focussing and/or relative movement of the structuring laser beam is controlled by the aid of position marks provided on the deflection mirror.

22. The method according to claim 21, wherein deviations of the mirror surface from the desired position are detected by the aid of position marks and, as a function thereof, the structuring laser beam used for structuring the optical waveguide is controlled for an optimum guidance of the light beam.

23. The method according to claim 18, wherein said structuring of the optical waveguide is stopped at a distance in front of the deflection mirror.

24. The method according to claim 18, wherein the optical waveguide is extended directly as far as the deflection mirror during structuring.

25. The method according to claim 18, wherein two optical waveguides are structured in the optical layer material, namely one for a light beam impinging on the deflection mirror and one for the light beam reflected by it.

26. The method according to claim 25, wherein a focussing lens is produced in the optical material in the region of the end of the one of the optical waveguides, on the surface of the optical material.

27. The method according to claim 26, wherein the lens is produced during structuring by photon absorption using the laser beam.

28. The method according to claim 26, wherein the lens is produced by laser ablation.

29. The method according to claim 26, wherein the lens is produced by a molding or stamping process.

30. The method according to claim 18, wherein the deflection mirror is produced by molding and curing a moldable material, e.g. an inorganic-organic hybrid polymer or a thermoplastic material, on a support made, e.g., of silicon, glass, polymer like polyimide or polycarbonate.

* * * * *